US012677513B2

(12) United States Patent
Wang et al.

(10) Patent No.: US 12,677,513 B2
(45) Date of Patent: Jul. 7, 2026

(54) DISPLAY PANEL HAVING LEDS EMITTING LIGHT OF THE SAME COLOR AND DISPLAY APPARATUS

(71) Applicant: BOE TECHNOLOGY GROUP CO., LTD., Beijing (CN)

(72) Inventors: Wei Wang, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 757 days.

(21) Appl. No.: 17/920,837

(22) PCT Filed: Nov. 19, 2021

(86) PCT No.: PCT/CN2021/131769
§ 371 (c)(1),
(2) Date: Oct. 24, 2022

(87) PCT Pub. No.: WO2023/087250
PCT Pub. Date: May 25, 2023

(65) Prior Publication Data
US 2024/0222575 A1 Jul. 4, 2024

(51) Int. Cl.
*H10H 20/855* (2025.01)
*H10H 20/812* (2025.01)
(Continued)

(52) U.S. Cl.
CPC ........ *H10H 20/855* (2025.01); *H10H 20/812* (2025.01); *H10H 20/831* (2025.01); *H10H 20/8512* (2025.01); *H10W 90/00* (2026.01)

(58) Field of Classification Search
CPC .. H10H 20/855; H10H 20/831; H10H 20/812; H10H 20/8512; H01L 25/0753; H10W 90/00
See application file for complete search history.

(56) References Cited

U.S. PATENT DOCUMENTS

2001/0036014 A1* 11/2001 Sasano ................ H10F 39/8063
                                              359/619
2014/0339495 A1* 11/2014 Bibl ..................... H10H 20/812
                                              257/13
(Continued)

FOREIGN PATENT DOCUMENTS

CN        105097878 A     11/2015
CN        108766273 A     11/2018
          (Continued)

*Primary Examiner* — Norman D Richards
*Assistant Examiner* — Sean Ayers Winters
(74) *Attorney, Agent, or Firm* — HOUTTEMAN LAW LLC

(57) ABSTRACT

Embodiments of the present disclosure provide a display panel and a display apparatus. Display substrate includes: light-emitting device groups, light-transmitting part groups and optical structure elements. The light-emitting device groups are on a base substrate, each light-emitting device group includes micro light-emitting diodes including first and second micro light-emitting diodes each to emit light of preset color; each light-transmitting part group includes light-transmitting parts including a first and second color conversion parts; and each optical structure group is to direct light emitted from the first micro light-emitting diode to the first color conversion part, and direct light emitted from the second micro light-emitting diode to the second color conversion part. The first color conversion part is to convert light of the preset color into light of a first color, and the second color conversion part is to convert light of the preset color into light of a second color.

20 Claims, 10 Drawing Sheets

(51) Int. Cl.
    *H10H 20/831*     (2025.01)
    *H10H 20/851*     (2025.01)
    *H10W 90/00*     (2026.01)

(56)             References Cited

U.S. PATENT DOCUMENTS

| | | | | |
|---|---|---|---|---|
| 2014/0367633 | A1* | 12/2014 | Bibl | H10K 59/38 |
| | | | | 257/13 |
| 2017/0025399 | A1* | 1/2017 | Takeya | H05B 33/14 |
| 2019/0140148 | A1* | 5/2019 | Yoshimura | C09K 11/0883 |
| 2019/0371974 | A1* | 12/2019 | Hussell | H10H 20/852 |

FOREIGN PATENT DOCUMENTS

| | | | |
|---|---|---|---|
| CN | 110928021 | A | 3/2020 |
| CN | 112510076 | A | 3/2021 |
| CN | 214672621 | U | 11/2021 |
| JP | 2010151880 | A | 7/2010 |
| WO | WO202305012 | A1 | 4/2023 |

* cited by examiner (a)

(b)

First direction

（a）

（b）

11

First direction (a)

(b)

DISPLAY PANEL HAVING LEDS EMITTING LIGHT OF THE SAME COLOR AND DISPLAY APPARATUS

CROSS-REFERENCE TO RELATED APPLICATION

This is a National Phase Application filed under 35 U.S.C. 371 as a national stage of PCT/CN2021/131769, filed on Nov. 19, 2021.

TECHNICAL FIELD

The present disclosure relates to the field of display technology, and specifically relates to a display panel and a display apparatus.

BACKGROUND

Due to the advantages of high color gamut, high contrast and high response speed, the micro light-emitting diode (LED) display technology is regarded as a very promising direction in the future development of display.

SUMMARY

The present disclosure provides a display panel and a display apparatus.

The present disclosure provides a display panel, including: a plurality of light-emitting device groups, a plurality of light-transmitting part groups and a plurality of optical structure elements, wherein the plurality of light-emitting device groups are disposed on a base substrate, each of the plurality of light-emitting device groups includes a plurality of micro light-emitting diodes, the plurality of micro light-emitting diodes include a first micro light-emitting diodes and a second micro light-emitting diodes, and the first micro light-emitting diode and the second micro light-emitting diode are each configured to emit light of a preset color; the plurality of light-transmitting part groups are disposed on a light-emitting side of the plurality of light-emitting device groups, each of the plurality of light-transmitting part groups includes a plurality of light-transmitting parts, and the plurality of light-transmitting parts include a first color conversion part and a second color conversion part; and the plurality of optical structure elements are disposed between the plurality of light-emitting device groups and the plurality of light-transmitting part groups, an orthographic projection of each of the plurality of optical structure elements on the base substrate covers an orthographic projection of at least one of the plurality of light-emitting device groups on the base substrate, each of the plurality of optical structure elements is configured to direct light emitted from the first micro light-emitting diode to the first color conversion part, and direct light emitted from the second micro light-emitting diode to the second color conversion part, wherein the first color conversion part is configured to convert light of the preset color into light of a first color, and the second color conversion part is configured to convert light of the preset color into light of a second color.

In some embodiments, the light of the first color is different from the light of the second color in wavelength range.

In some embodiments, a plurality of light-emitting devices of the light-emitting device group further include: a third micro light-emitting diode configured to emit light of the preset color, the plurality of light-transmitting parts in the light-transmitting part group further include a light-passing part, the orthographic projection of each of the plurality of optical structure elements on the base substrate further covers an orthographic projection of the third micro light-emitting diode on the base substrate, and each of the plurality of light-emitting structure elements is further configured to direct light emitted from the third micro light-emitting diode to the light-passing part.

In some embodiments, the light of the preset color is blue light, the light of the first color is red light, and the light of the second color is green light.

In some embodiments, a plurality of light-emitting devices of the light-emitting device group further include: a third micro light-emitting diode configured to emit light of the preset color, the plurality of light-transmitting parts of the light-transmitting part group further include a light-passing part, the orthographic projection of each of the plurality of optical structure elements on the base substrate further covers an orthographic projection of the third micro light-emitting diode on the base substrate, and each of the plurality of light-emitting structure elements is further configured to direct light emitted from the third micro light-emitting diode to the third color conversion part, and the third color conversion part is configured to convert light of the preset color into light of a third color.

In some embodiments, the light of the preset color is ultraviolet light, the light of the first color is red light, the light of the second color is green light, and the light of the third color is blue light; or the light of the preset color is blue light having a first wavelength, the light of the first color is red light, the light of the second color is green light, the light of the third color is blue light having a second wavelength, and the first wavelength is less than the second wavelength.

In some embodiments, the display panel further includes; light-transmitting carriers in one-to-one correspondence with the plurality of light-emitting device groups, and the light-transmitting carriers corresponding to different light-emitting device groups are arranged at intervals; and a barrier layer on a side of the light-transmitting carriers facing the base substrate, wherein a plurality of accommodation openings are provided in the barrier layer, and the plurality of micro light-emitting diodes of the light-emitting device group are in the plurality of accommodation openings in one-to-one correspondence.

In some embodiments, a light-shielding layer is provided between any adjacent two of the light-transmitting carriers.

In some embodiments, the micro light-emitting diode includes: a first electrode on a side of the light-transmitting carriers facing the base substrate; a light-emitting stack on a side of the first electrode away from the light-transmitting carriers and including: a first-type doped semiconductor layer, a quantum well layer and a second-type doped semiconductor layer sequentially arranged in a direction away from the light-transmitting carriers; and a second electrode on a side of the light-emitting stack away from the light-transmitting carriers.

In some embodiments, the display panel further includes: a packaging layer on a side of the plurality of light-emitting device groups away from the base substrate; and a filling layer between the packaging layer and the plurality of optical structure elements; a spacer substrate between the plurality of optical structure elements and the plurality of light-transmitting part groups; wherein the optical structure element has a refractive index greater than the filling layer, a surface of the optical structure element facing the filling layer is a convex curved surface that is attached to the filling layer.

In some embodiments, the display panel further includes: a packaging layer on a side of the plurality of light-emitting device groups away from the base substrate, wherein the plurality of optical structure elements are disposed on a surface of the packaging layer away from the base substrate; and a spacer substrate between the plurality of optical structure elements and the plurality of light-transmitting part groups and provided with recesses in one-to-one correspondence with the optical structure elements, wherein a surface of the optical structure element facing the spacer substrate is a convex curved surface that is attached to a corresponding recess, and the optical structure element has a refractive index greater than the spacer substrate.

In some embodiments, the plurality of optical structure elements are condenser lenses, and a distance between the plurality of micro light-emitting diodes and the plurality of optical structure elements is 1 or 2 times a focal length of the condenser lenses.

In some embodiments, an orthographic projection of the first color conversion part on the base substrate has an area larger than an orthographic projection of the first micro light-emitting diode on the base substrate; and an orthographic projection of the second color conversion part on the base substrate has an area larger than an orthographic projection of the second micro light-emitting diode on the base substrate.

In some embodiments, the first color conversion part and the second color conversion part are each made of a material including a quantum dot material or a phosphor material.

In some embodiments, the display panel further includes: an accommodation structure layer having a plurality of accommodation grooves in which the plurality of light-transmitting parts are provided in one-to-one correspondence with the plurality of accommodation grooves.

In some embodiments, the plurality of light-transmitting parts of each light-transmitting part group are sequentially arranged in a first direction, and the plurality of micro light-emitting diodes of each light-emitting device groups are sequentially arranged in the first direction, wherein for any light-emitting device group, after passing through the optical structure element, light emitted from a $i^{th}$ micro light-emitting diode is radiated to a $(m-i+1)^{th}$ light-transmitting part of a corresponding light-transmitting part group, where m is a number of the plurality of light-transmitting parts of the light-transmitting part group, i is an integer, and $1 \leq i \leq m$.

In some embodiments, the plurality of micro light-emitting diodes of each light-emitting device group are divided into at least one repetitive unit, each repetitive unit including: the third micro light-emitting diode, the second micro light-emitting diode and the first micro light-emitting diode sequentially arranged in the first direction.

In some embodiments, the plurality of light-transmitting parts of each light-transmitting part group are divided into n first repetitive units arranged in a second direction, each repetitive unit including c light-transmitting parts arranged in the first direction; the plurality of micro light-emitting diodes of each light-emitting device group are divided into n second repetitive units arranged in the second direction, each repetitive unit including c micro light-emitting diodes arranged in the first direction; wherein the first direction intersects the second direction; and for any light-emitting device group, after passing through the optical structure element, light emitted from a $q^{th}$ micro light-emitting diode of a $j^{th}$ second repetitive unit is radiated to a $(c-q+1)^{th}$ light-transmitting part of a $(n-j+1)^{th}$ first repetitive unit of a corresponding light-transmitting part group, where n and c are both integers greater than 1, q and j are both integers, $1 \leq q \leq c$ and $1 \leq j \leq n$.

In some embodiments, in each light-emitting device group, each second repetitive unit includes: the third micro light-emitting diode, the second micro light-emitting diode, the first micro light-emitting diode, the third micro light-emitting diode, the second micro light-emitting diode, and the first micro light-emitting diode sequentially arranged in the first direction; or, in each light-emitting device group, some of the second repetitive units each include: the second micro light-emitting diode, the first micro light-emitting diode, and the third micro light-emitting diode sequentially arranged in the first direction, while remaining second repetitive units each include: the third micro light-emitting diode, the second micro light-emitting diode, and the first micro light-emitting diode sequentially arranged in the first direction; or, in each light-emitting device group, some of the second repetitive units each include: the second micro light-emitting diode, the first micro light-emitting diode, the second micro light-emitting diode, and the third micro light-emitting diode sequentially arranged in the first direction; while remaining second repetitive units each include: the second micro light-emitting diode, the third micro light-emitting diode, the second micro light-emitting diode, and the first micro light-emitting diode sequentially arranged in the first direction.

An embodiment of the present disclosure further provides a display apparatus, including the display panel as described above.

BRIEF DESCRIPTION OF DRAWINGS

Accompanying drawings are provided for further understanding of the present disclosure and constitute a part of the specification. Hereinafter, these drawings are intended to explain the present disclosure together with the following specific implementations, but should not be considered as a limitation of the present disclosure, in which.

DETAIL DESCRIPTION OF EMBODIMENTS

Figure 1:
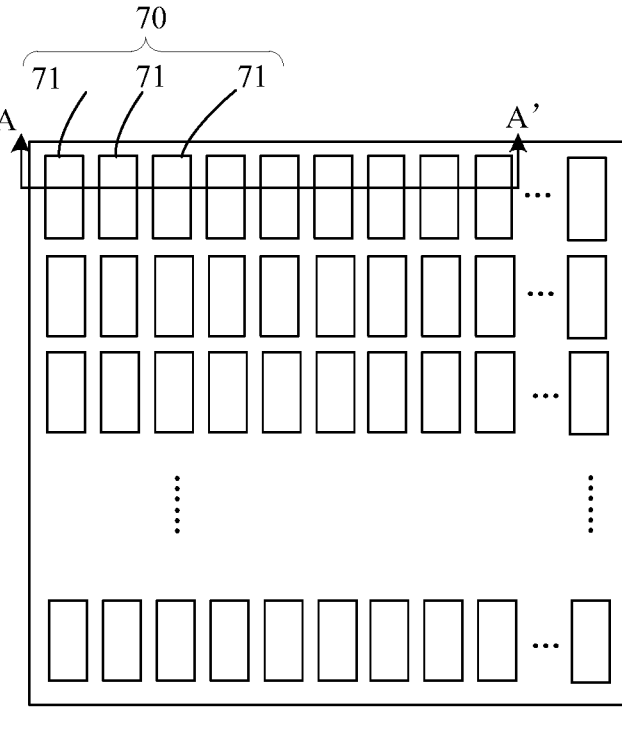
FIG. 1 is a plan view of a display panel according to some embodiments of the present disclosure.

Hereinafter, specific implementations of the present disclosure will be described with respect to the accompanying drawings. It will be appreciated that the specific implementations as set forth herein are merely for the purpose of illustration and explanation of the present disclosure and should not be constructed as a limitation thereof.

To make the objects, technical solutions and advantages of the embodiments of the present disclosure more apparent, the technical solutions according to the embodiments of the present disclosure will be clearly and completely described below with reference to the drawings of the embodiments of the present disclosure. Apparently, the described exemplary embodiments are some, but not all, of the embodiments of the present disclosure. All other embodiments obtained by those of ordinary skill in the art based on the embodiments of the present disclosure described herein without paying any creative effort shall be included in the protection scope of the present disclosure.

The terminology used herein to describe embodiments of the disclosure is not intended to limit and/or define the scope of the present disclosure. For example, unless otherwise defined, technical or scientific terms used in the present disclosure are intended to have general meanings as understood by those of ordinary skill in the art. It will be appreciated that the words "first", "second" and similar terms used in the present disclosure do not denote any order, quantity, or importance, but are used merely for distinguishing different components from each other. The singular forms "a," "an," or "the" and similar referents do not denote a limitation of quantity, but rather denote the presence of at least one, unless the context clearly dictates otherwise. The word "comprise" or "include", and the like, means that the element or item appearing in front of the word "comprise" or "include" includes the element or item listed after the word "comprise" or "include" and equivalents thereof, and does not exclude other elements or items. The terms "connected" or "coupled" and the like are not restricted to physical or mechanical connections, but may include electrical connections, whether direct or indirect. The words "upper", "lower", "left", "right", or the like are merely used to indicate a relative positional relationship, and when an absolute position of the described object is changed, the relative positional relationship may also be changed accordingly.

In the following description, when an element or layer is referred to as being "on" or "connected to" another element or layer, it can be directly on, connected to, the other element or layer, or intervening elements or layers may be present. However, when an element or layer is referred to as being "directly on" or "directly connected to" another element or layer, there is no intervening element or layer present. The term "and/or" includes any and all combinations of one or more of the associated listed items.

In some examples, the display panel includes a plurality of micro light-emitting diodes on a base, and the plurality of micro light-emitting diodes include a red micro light-emitting diode, a green micro light-emitting diode, and a blue micro light-emitting diode. However, the three types of micro light-emitting diodes have different electronic-to-optical conversion efficiency, and it is difficult to achieve white balance. To achieve white balance, the driving current for the red micro light-emitting diode needs to be increased, leading to increased power consumption. Moreover, the cost of the red micro light-emitting diode is higher, and the mixed fabrication of the three colors of micro light-emitting diodes involves a complex manufacturing process and has a yield lower than that of a micro light-emitting diode having a single color. In particular, as the size of the micro light-emitting diode reduces, the yield of the mixed fabrication of micro light-emitting diodes is further reduced.

Figure 2:
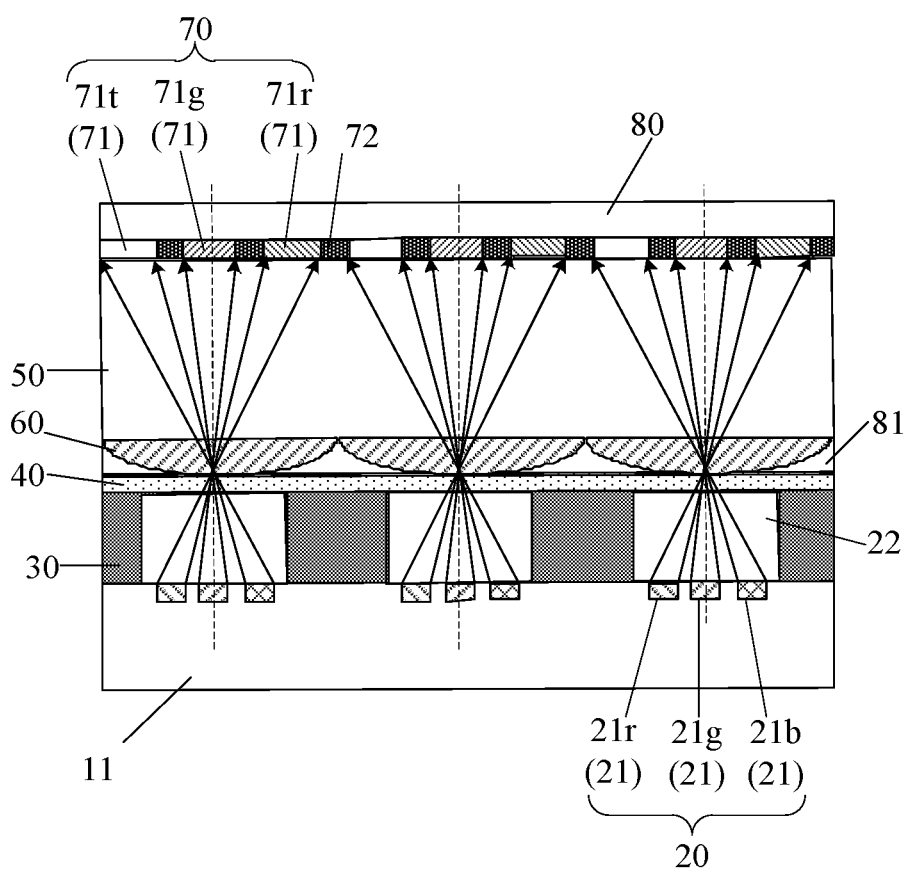
FIG. 2 is a cross-sectional view taken along line A-A' of FIG. 1 according to some embodiments of the present disclosure.

FIG. 1 is a plan view of a display panel according to some embodiments of the present disclosure, and FIG. 2 is a cross-sectional view taken along line A-A' of FIG. 1 according to some embodiments of the present disclosure. As shown in FIG. 1, the display panel includes: a base substrate 11, a plurality of light-emitting device groups 20, a plurality of light-transmitting part groups and a plurality of optical structure elements.

The base substrate 11 may be a glass substrate, or may be a flexible substrate made of a flexible material such as polyimide (PI) to facilitate flexible display.

The light-emitting device groups 20 are disposed on the base substrate 11, and each light-emitting device group 20 includes a plurality of micro light-emitting diodes 21 configured to emit light of a preset color. The plurality of micro light-emitting diodes 21 in each light-emitting device group 20 may include a first micro light-emitting diode 21*r* and a second micro light-emitting diode 21*g*. The base substrate 11 may be further provided with a driving structure layer configured to provide a driving signal for each micro light-emitting diode 21 to drive the micro light-emitting diode 21 to emit light.

The plurality of light-transmitting part groups 70 are disposed on a light-emitting side of the light-emitting device groups 20, and each light-transmitting part group 70 includes a plurality of light-transmitting parts 71 including a first color conversion part 71*r* and a second color conversion part 71*g*. The first color conversion part 71*r* is configured to convert, upon receiving light of the preset color, the light of the preset color into light of a first color; and the second color conversion part 71*g* is configured to convert, upon receiving light of the preset color, the light of the preset color into light of a second color.

The plurality of optical structure elements 60 are disposed between the plurality of light-emitting device groups 20 and the plurality of light-transmitting part groups 70, an orthographic projection of each optical structure element 60 on the base substrate 11 covers an orthographic projection of at least one light-emitting device group 20 on the base substrate 11, and orthographic projections of different optical structure elements 60 on the base substrate 11 do not overlap. Each optical structure element 60 is configured to direct light emitted from the first micro light-emitting diode 21*r* to the first color conversion part 71*r*, so that the first color conversion part 71*r* converts the light of the preset color into light of the first color; and direct light emitted from the second micro light-emitting diode 21*g* to the second color conversion part 71*g*, so that the second color conversion part 71*g* converts the light of the preset color into light of the second color.

In an embodiment of the present disclosure, each light-emitting device in the light-emitting device groups 20 emits light of the preset color, the optical structure elements 60 are disposed between the light-emitting device groups 20 and the plurality of light-transmitting part groups 70, after passing through the optical structure element 60, light emitted from a first micro light-emitting diode 21*r* may be radiated on the first color conversion part 71*r*, and after passing through the optical structure element 60, light emitted from a second micro light-emitting diode 21*g* may be radiated on the second color conversion part 71*g*. Since all the light-emitting devices emit light of a same color, the light-emitting devices have a same electronic-to-optical conversion efficiency, so that white balance can be achieved without increasing the power consumption. Moreover, compared with micro light-emitting diodes of multiple colors, the light-emitting device groups 20 in the embodiments of the present disclosure may use the micro light-emitting diodes 21 having a single color, thereby simplifying the manufacturing process and increasing the product yield.

In some embodiments, the light of the first color may be different from the light of the second color in wavelength range. For example, the light of the first color is red light, and the light of the second color is green light.

In some embodiments, as shown in FIG. 2, the plurality of light-emitting devices in the light-emitting device groups 20 may include, in addition to the first micro light-emitting diode 21*r* and the second micro light-emitting diode 21*g*: a third micro light-emitting diode 21*b* configured to emit light of a preset color. Each light-transmitting part group 70 further includes a light-passing part 71*t*, an orthographic projection of each optical structure element on the base substrate 11 further covers an orthographic projection of the third micro light-emitting diode 21*b* on the base substrate 11, and each optical structure element is further configured to direct light emitted from the third micro light-emitting diode 21*b* to the light-passing part 71*t*. The light of the preset color may be blue light, the light of the first color may be red light, and the light of the second color may be green light. In this case, the first color conversion part 71*r* receives the blue light emitted from the first micro light-emitting diode 21*r* and then emits red light; the second color conversion part 71*g* receives the blue light emitted from the second micro light-emitting diode 21*g* and then emits green light; and the light-passing part 71*t* does not change the color of the received light.

The first color conversion part 71*r* and the second color conversion part 71*g* are each made of a material including a quantum dot material. For example, the first color conversion part 71*r* is made of a material including a red quantum dot material, the second color conversion part 71*g* is made of a material including a green quantum dot material, and the light-passing part 71*t* is made of a material including a scattering particle material. The red quantum dot material is configured to emit red light under excitation of the light of the preset color; and the green quantum dot material is configured to emit green light under excitation of the light of the preset color. The red quantum dot material and the green quantum dot material may each include at least one of indium phosphide (InP), zinc oxide (ZnO), graphene, cadmium selenide (CdSe), cadmium sulfide (CdS), cadmium telluride (CdTe), zinc selenide (ZnSe), zinc telluride (ZnTe), and zinc sulfide (ZnS). A luminescent color for the quantum dot material may be controlled by controlling a particle size of the quantum dot material. The light-passing part 71*t* is made of a material including a scattering particle material, so as to scatter the received blue light.

In addition, the first color conversion part 71*r* and the second color conversion part 71*g* may be doped with scattering particles to increase emission angles of the first color conversion part 71*r* and the second color conversion part 71*g*.

Apparently, the first color conversion part 71*r* and the second color conversion part 71*g* may be formed of a phosphor material.

As shown in FIG. 2, the display panel further includes light-transmitting carriers 22, which may be sapphire substrates, in one-to-one correspondence with the light-emitting device groups 20. The light-transmitting carriers 22 corresponding to different light-emitting device groups 20 are arranged at intervals. The plurality of micro light-emitting diodes 21 in a same light-emitting device group 20 are disposed on a same light-transmitting carrier 22. The micro light-emitting diodes 21 may be fixed on a driving structure layer of the base substrate 11 through transfer, die bonding, or other processes. By providing the plurality of micro light-emitting diodes 21 of the same light-emitting device group 20 on the same light-transmitting carrier 22, the transfer efficiency and yield may be improved.

Figure 3:
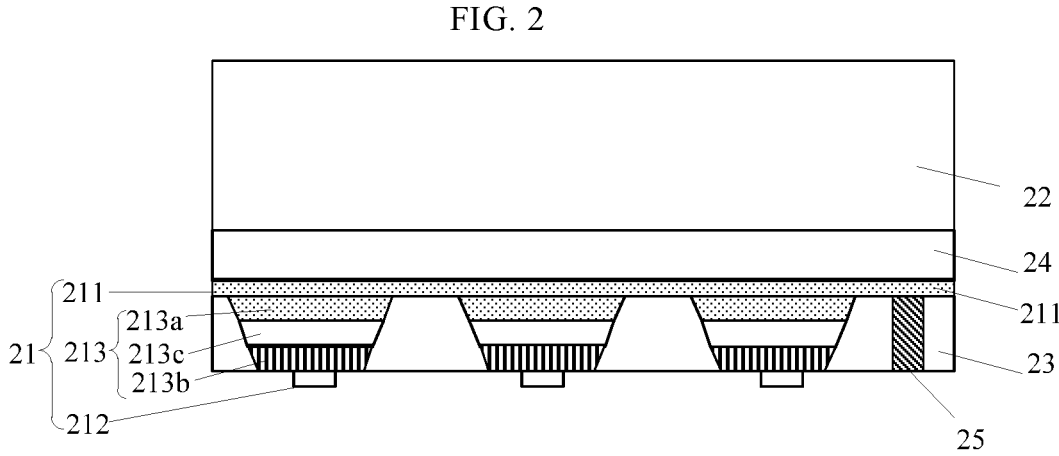
FIG. 3 is a schematic structural diagram of a light-emitting device group according to some embodiments of the present disclosure.

FIG. 3 is a schematic structural diagram of a light-emitting device group according to some embodiments of the present disclosure. As shown in FIGS. 2 and 3, a barrier layer 23 is provided on a side of the light-transmitting carriers 22 facing the base substrate 11, a plurality of accommodation openings are provided in the barrier layer 23 and are in one-to-one correspondence with the micro light-emitting diodes 21 of the corresponding light-emitting device group 20, and each micro light-emitting diode 21 is disposed in a corresponding accommodation opening. An insulating material of the barrier layer 23 may include a transparent insulating material such as resin, a photoresist material, silicon oxide, or silicon nitride. Cross-sectional areas of the accommodation openings may gradually increase in a direction approaching the light-transmitting carriers 22. It should be noted that FIG. 3 illustrates an example in which each light-emitting device group 20 includes three micro light-emitting diodes 21, but in fact, the light-emitting device group 20 may include other numbers of micro light-emitting diodes 21.

As shown in FIG. 3, each micro light-emitting diode 21 includes: a first electrode 211, a light-emitting stack 213 and a second electrode 212. The first electrode 211 is located on a side of the light-transmitting carrier 22 facing the base substrate 11. The light-emitting stack 213 is located on a side of the first electrode 211 away from the light-transmitting carrier 22. The second electrode 212 is located on a side of the light-emitting stack 213 away from the light-transmitting carrier 22. The light-emitting stack 213 includes a first-type doped semiconductor layer 213*a*, a quantum well layer 213*c* and a second-type doped semiconductor layer 213*b* sequentially arranged in a direction away from the light-transmitting carrier 22. In some examples, the first-type doped semiconductor layer 213*a* may be an N-type doped semiconductor material, for example, N—GaN; and the second-type doped semiconductor layer 213*b* may be a P-type doped semiconductor material, for example, P—GaN. The first electrode 211 may be made of the same material as the first-type doped semiconductor layer 213*a*.

In an embodiment, a sum of thicknesses of the first electrode 211 and the first-type doped semiconductor layer 213*a* may be between 1 μm and 3 μm, a thickness of the quantum well layer may be between 0.2 μm and 0.5 μm, and a thickness of the second-type doped semiconductor layer 213b may be between 0.05 μm and 0.3 μm.

In an embodiment, the first electrodes 211 of the plurality of micro light-emitting diodes 21 in the same light-emitting device group 20 may be connected to form an integral structure, while the second electrodes 212 of different micro light-emitting diodes 21 are insulated from each other. The integrally connected first electrodes 211 may be coupled to the driving structure layer through wires 25, each second electrode 212 may be coupled to the driving structure layer, and the driving structure layer may provide a first signal for the first electrode 211 of each micro light-emitting diode 21 and a second signal for the second electrode 212 of each micro light-emitting diode 21, so as to drive the plurality of micro light-emitting diodes 21 to emit light.

As shown in FIG. 3, a buffer layer 24 may be disposed between the light-transmitting carrier 22 and the micro light-emitting diodes 21, so as to avoid a problem of lattice mismatch due to the case that film layers of the micro light-emitting diode 21 are epitaxially grown on the light-transmitting carrier 22 directly.

With continued reference to FIG. 2, a light-shielding layer 30 is disposed between the light-transmitting carriers 22 corresponding to any two adjacent light-emitting device groups 20, and configured to prevent light crosstalk between different light-emitting device groups 20. The light-shielding layer 30 may be made of a black light-absorbing material.

The display panel further includes: a packaging layer 40, and a filling layer 81. The packaging layer 40 is located on a side of the plurality of light-emitting device groups 20 away from the base substrate 11, and configured to package the plurality of light-emitting device groups 20. The plurality of optical structure elements 60 are located on a side of the packaging layer 40 away from the base substrate 11, and the filling layer 81 is located between the plurality of optical structure elements 60 and the packaging layer 40. In some embodiments, the optical structure elements 60 are condenser lenses, and a surface of each optical structure element 60 facing the filling layer 81 is a convex curved surface that is attached to the filling layer 81. In this case, the optical structure element 60 has a refractive index greater than that of the filling layer 81.

The display panel further includes: a spacer substrate 50 between the plurality of optical structure elements 60 and the plurality of light-emitting part groups 70. The spacer substrate 50 may be a glass substrate or a flexible substrate made of a resin material. By providing the spacer substrate 50, a certain distance is present between the light-transmitting part groups 70 and the light-emitting device groups 20, so that crosstalk between different light-transmitting parts 71 is avoided, and heat generated by the micro light-emitting diodes 21 is prevented from affecting the service life of the light-transmitting parts 71. The optical structure elements 60 and the spacer substrate 50 may be formed as a single piece. For example, the spacer substrate 50 is made of a resin material, and the optical structure elements 60 may be formed by a process such as hot pressing, injection molding, or photolithography.

It should be noted that, in the embodiments of the present disclosure, the case where each optical structure element 60 is a single-curved condenser lens is taken as an example for illustration, but apparently, the optical structure element 60 may also be a double-curved condenser lens, or may be an optical structure such as a diffraction lens or a metalens/metasurface lens on the spacer substrate 50.

An accommodation structure layer 72 is provided on a side of the spacer substrate 50 away from the base substrate 11, and the accommodation structure layer 72 has a plurality of accommodation grooves into which the light-transmitting parts 71 are placed in one-to-one correspondence. The accommodation structure layer 72 is made of an opaque material. A protective layer 80 configured to protect the light-transmitting parts 71 may be further disposed on a side of the accommodation structure layer 72 away from the base substrate 11. The protective layer 80 may be a glass layer, or a flexible film layer made of a resin material.

Figure 4:
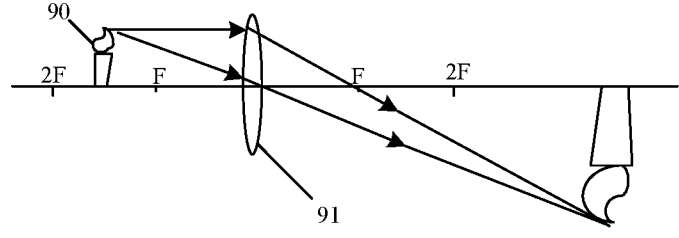
FIG. 4 is a schematic diagram of the lens imaging principle.

In some embodiments, the optical structure elements 60 are condenser lenses, such as convex lenses. FIG. 4 is a schematic diagram of the lens imaging principle. As shown in FIG. 4, the mark F represents a focus position of a convex lens 91, and the mark 2F represents a position of twice the focal length of the convex lens 91. When a light source 90 is positioned on one side of the convex lens 91 and between 1 and 2 times the focal length of the convex lens 91, an inverted image may be formed on the other side of the convex lens 91. Therefore, in order to enable the light from each first micro light-emitting diode 21r to be radiated on the first color conversion part 71r, and the light from each second micro light-emitting diode 21g to be radiated on the second color conversion part 71g, in some embodiments of the present disclosure, the optical structure elements 60 are condenser lenses, and a distance between the plurality of micro light-emitting diodes 21 and the optical structure elements 60 is 1 or 2 times the focal length of the condenser lenses.

Figure 5:
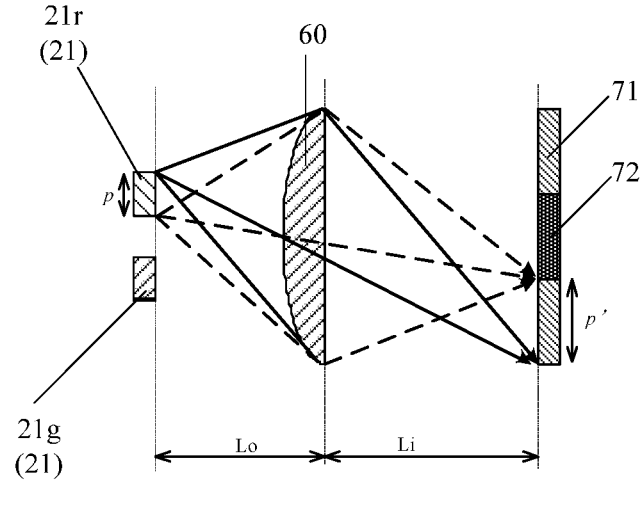
FIG. 5 is a schematic diagram showing light emitted from a light-emitting device group radiates on a light-transmitting part group according to some embodiments of the present disclosure.

FIG. 5 is a schematic diagram showing light emitted from a light-emitting device group radiates on a light-transmitting part group according to some embodiments of the present disclosure. As shown in FIG. 5, when the medium between the micro light-emitting diode 21 and the optical structure element 60 and the medium between the optical structure element and the light-transmitting part group 70 are air layers, a distance Lo between the micro light-emitting diode 21 and the optical structure element 60 and a distance Li between the optical structure element 60 and the light-transmitting part group 70 satisfy the lens imaging formula: $1/Lo+1/Li=1/f$, and a magnification of the condenser lens satisfies $M=p'/p=Li/Lo$, where f is the focal length of the condenser lens, and the first color conversion part 71r, the second color conversion part 71g, and the light-transmitting part 71t each have a size of p', and the micro light-emitting diode has a size of p. In practical applications, p' may be determined according to the desired resolution, and when p' is determined, an equivalent air distance between the micro light-emitting diode 21 and the condenser lens, and an equivalent air distance between the condenser lens and the light-transmitting part group 70 may be determined according to p, f, the magnification formula of the condenser lens, and the lens imaging formula.

It should be noted that the equivalent air distance refers to a distance between two structures when the medium between the two structures is air. Since the lens imaging formula and the magnification formula of the condenser lens are both established under the condition that the medium is air. But in the display panel, the medium between the condenser lens and the micro light-emitting diode 21 or between the condenser lens and the light-transmitting part group 70 is not air. Therefore, when the equivalent air distance is determined according to the above formulas, a thickness of each medium layer is determined according to the equivalent air distance, a refractive index of the medium between the condenser lens and the micro light-emitting diode 21, and a refractive index of the medium between the condenser lens and the light-transmitting part group 70.

In some embodiments of the present disclosure, the optical structure element 60 is a condenser lens with a magnification greater than 1, and in this case, an orthographic projection of the first color conversion part 71*r* on the base substrate 11 has an area larger than an orthographic projection of the first micro light-emitting diode 21*r* on the base substrate 11; an orthographic projection of the second color conversion part 71*g* on the base substrate 11 has an area larger than an orthographic projection of the second micro light-emitting diode 21*g* on the base substrate 11; and an orthographic projection of the light-passing part 71*t* on the base substrate 11 has an area larger than the orthographic projection of the third micro light-emitting diode 21*b* on the base substrate 11.

In an example, the magnification of the condenser lens is greater than 1 and less than 5.

Figure 6:
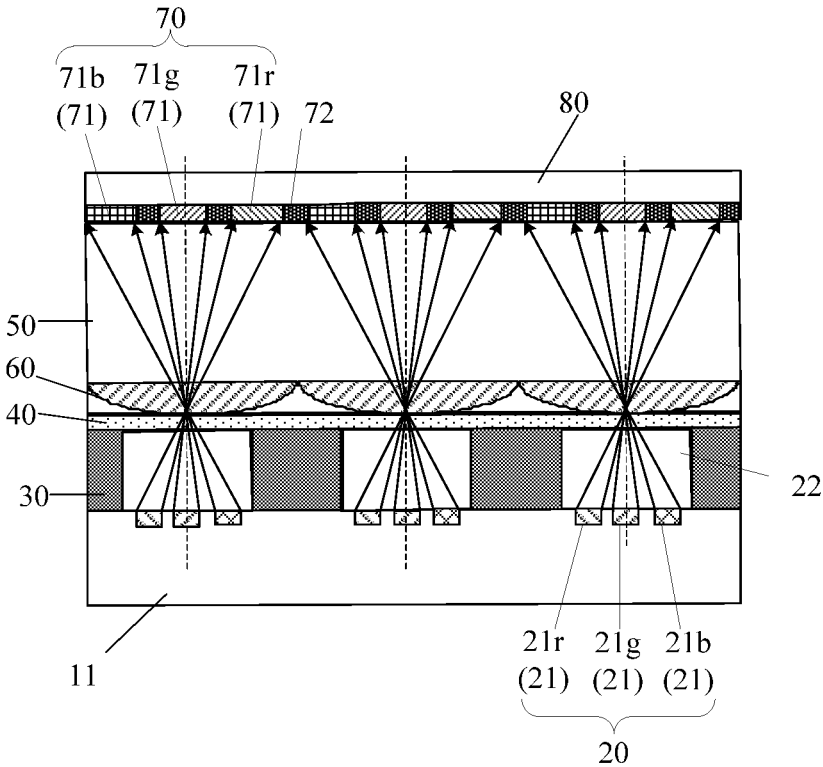
FIG. 6 is a cross-sectional view taken along line A-A' of FIG. 1 according to some other embodiments of the present disclosure.

FIG. 6 is a cross-sectional view taken along line A-A' of FIG. 1 according to some other embodiments of the present disclosure. The display panel shown in FIG. 6 is similar to the display panel shown in FIG. 2, except that in the display panel shown in FIG. 6, each light-transmitting part group 70 includes, instead of the light-passing part 71*t*, a third color conversion part 71*b*. In this case, each optical structure element 60 is further configured to direct light emitted from the third micro light-emitting diode 21*b* to the third color conversion part 71*b*, and the third color conversion part 71*b* is configured to convert light of the preset color into light of a third color.

In this case, the light of the preset color may be ultraviolet light, the light of the first color may be red light, the light of the second color may be green light, and the light of the third color may be blue light. Alternatively, the light of the preset color may be blue light of a first wavelength, the light of the first color may be red light, the light of the second color may be green light, the light of the third color may be blue light of a second wavelength, and the first wavelength is less than the second wavelength. The third color conversion part 71*b* may be made of a material including a quantum dot material or a phosphor material.

Figure 7:
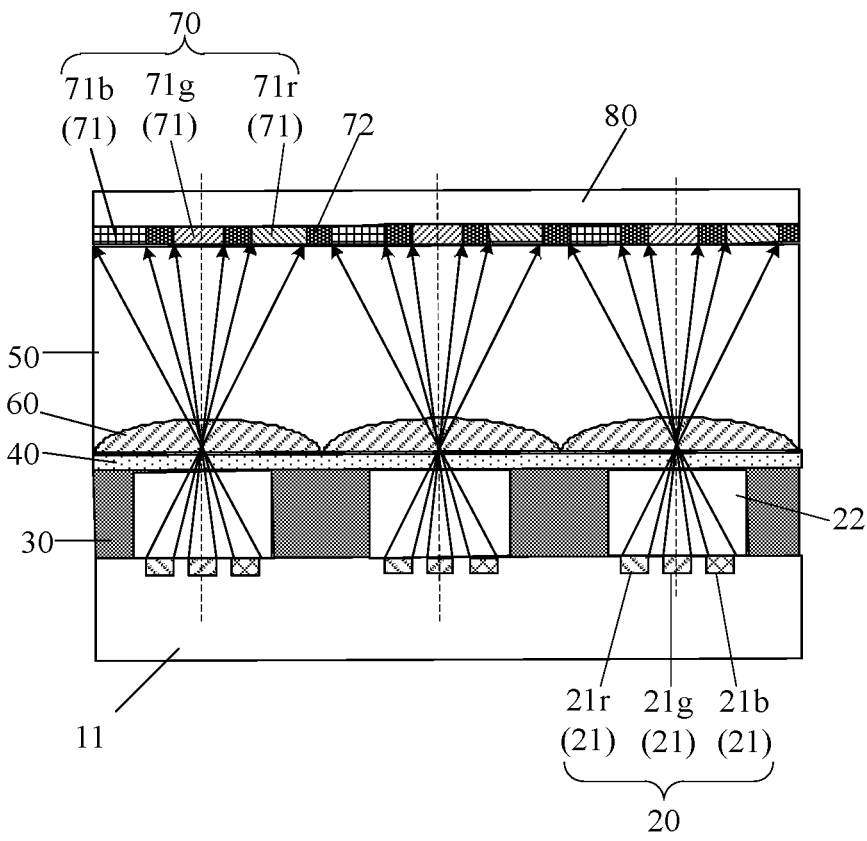
FIG. 7 is a cross-sectional view taken along line A-A' of FIG. 1 according to some other embodiments of the present disclosure.

It should be noted that, in both FIGS. 2 and 6, the case where the optical structure element 60 includes a condenser lens facing the base substrate 11 is taken as an example for illustration, but in other embodiments, it is also possible that a convex curved surface of the condenser lens faces the spacer substrate 50. FIG. 7 is a cross-sectional view taken along line A-A' of FIG. 1 according to some other embodiments of the present disclosure. The display panel shown in FIG. 7 differs from the display panel shown in FIG. 2 merely in that in FIG. 7, the spacer substrate 50 is provided with recesses in one-to-one correspondence with the optical structure elements 60, flat surfaces of the optical structure elements 60 may be attached to the packaging layer 40, convex curved surfaces of the optical structure elements 60 may be attached to the recesses, and the optical structure elements 60 may each have a refractive index greater than the spacer substrate 50.

Figure 8:
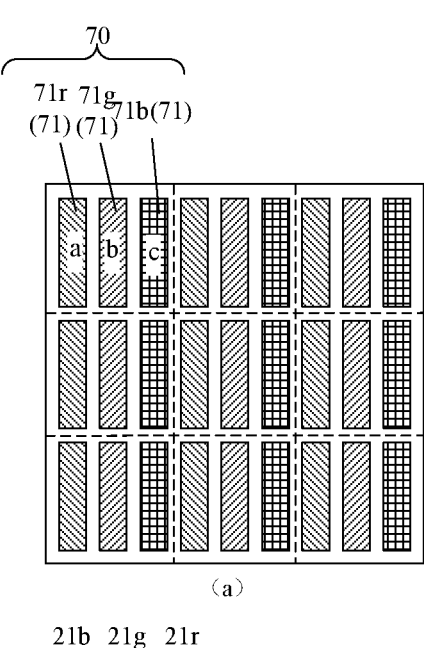
FIG. 8 is a first schematic diagram showing distribution of light-emitting device groups and light-transmitting part groups according to some embodiments of the present disclosure.
Figure 8:
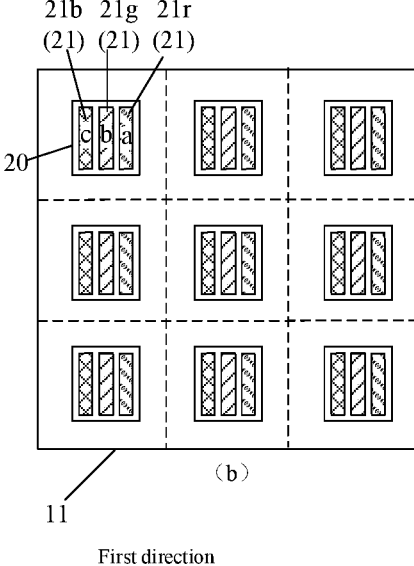
Figure 9:
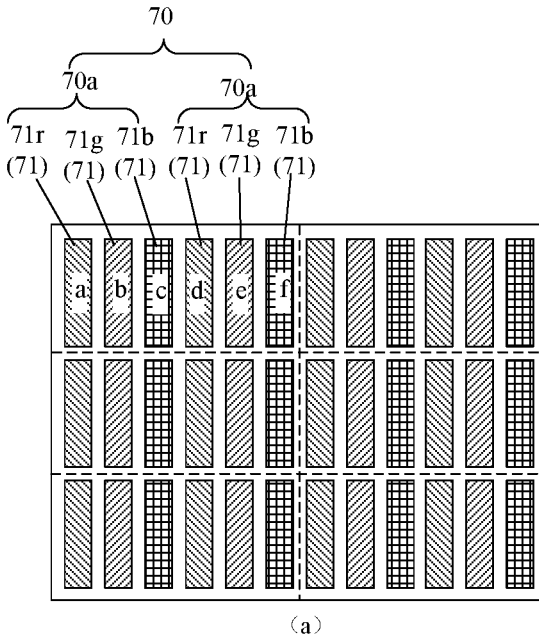
FIG. 9 is a second schematic diagram showing distribution of light-emitting device groups and light-transmitting part groups according to some embodiments of the present disclosure.
Figure 9:
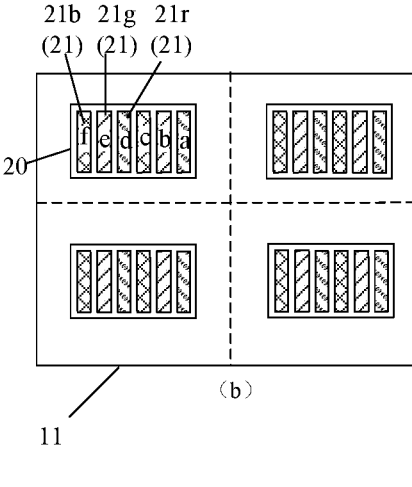

FIG. 8 is a first schematic diagram showing distribution of light-emitting device groups and light-transmitting part groups according to some embodiments of the present disclosure, and FIG. 9 is a second schematic diagram showing distribution of light-emitting device groups and light-transmitting part groups according to some embodiments of the present disclosure. As shown in FIGS. 8 and 9, the plurality of light-emitting device groups 20 are arranged in a plurality of rows and columns, and the plurality of micro light-emitting diodes 21 in each light-emitting device group 20 are sequentially arranged in a first direction. Accordingly, the plurality of light-transmitting part groups 70 are arranged in a plurality of rows and columns, and the plurality of light-transmitting parts 71 in each light-transmitting part group 70 are sequentially arranged in the first direction. The light-transmitting part groups 70 are in one-to-one correspondence with the light-emitting device groups 20, and an orthographic projection of each optical structure element 60 on the base substrate 11 covers an orthographic projection of one of the optical device groups 20 on the base substrate 11. For example, the orthographic projection of the optical structure element 60 on the base substrate 11 may coincide with, or be tangent to, the dashed box in FIG. 9. For any light-emitting device group 20, after passing through the optical structure elements 60, light emitted from a $i^{th}$ micro light-emitting diode 21 is radiated to a $(m-i+1)^{th}$ light-transmitting part in the corresponding light-transmitting part group 70, where m is a number of light-transmitting parts 71 of the light-transmitting part group 70, i is an integer, and $1 \le i \le m$. It should be noted that the term "$i^{th}$" refers to the $i^{th}$ one arranged in the first direction.

For example, in FIG. 8, the light-transmitting part group 70 at the upper left corner in figure (a) and the light-emitting device group 20 at the upper left corner in figure (b) are taken as examples; and in FIG. 9, the light-transmitting part group 70 at the upper left corner in figure (a) and the light-emitting device group 20 at the upper left corner in figure (b) are taken as examples. After passing through the condenser lens, light emitted from any micro light-emitting diode 21, denoted with a letter, is emitted toward the light-transmitting part 71 denoted with the same letter. As shown in FIGS. 8 and 9, the plurality of micro light-emitting diodes 21 of each light-emitting device group 20 are divided into at least one repetitive unit 70*a*, each repetitive unit 70*a* including: a first micro light-emitting diode 21*r*, a second micro light-emitting diode 21*g*, and a third micro light-emitting diode 21*b* sequentially arranged in the first direction.

For example, as shown in FIG. 8, the plurality of micro light-emitting diodes 21 of the light-emitting device group 20 constitute a repetitive unit 70*a*, which specifically includes: a third micro light-emitting diode 21*b*, a second micro light-emitting diode 21*g*, and a first micro light-emitting diode 21*r*. For another example, as shown in FIG. 9, the plurality of micro light-emitting diodes 21 of the light-emitting device group 20 constitute two repetitive units 70*a*, which specifically include a third micro light-emitting diode 21*b*, a second micro light-emitting diode 21*g*, a first micro light-emitting diode 21*r*, a third micro light-emitting diode 21*b*, a second micro light-emitting diode 21*g*, and a first micro light-emitting diode 21*r* arranged in the first direction. In FIGS. 8 and 9, the orthographic projection of each micro light-emitting diode 21 on the base substrate 11 may have the same area.

Figure 10:
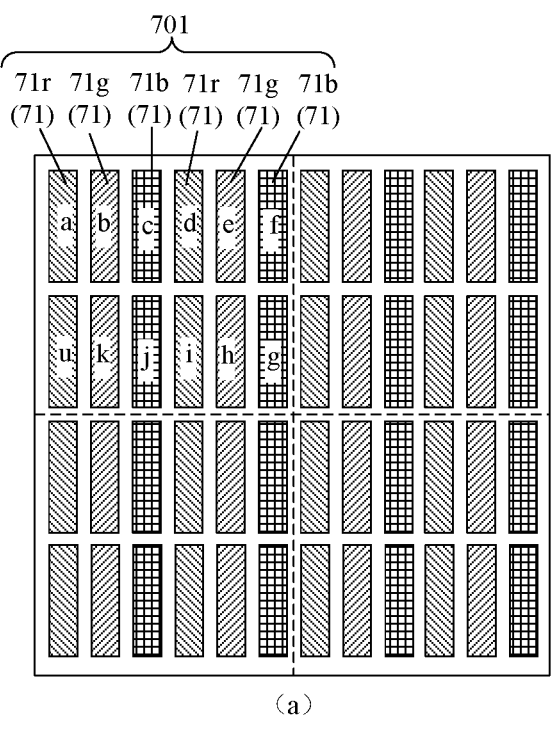
FIG. 10 is a first schematic diagram showing distribution of light-emitting device groups and light-transmitting part groups according to some other embodiments of the present disclosure.
Figure 10:
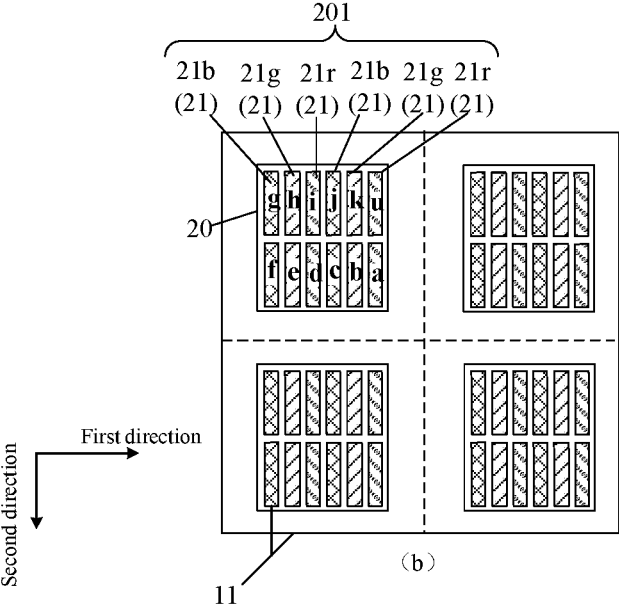
Figure 11:
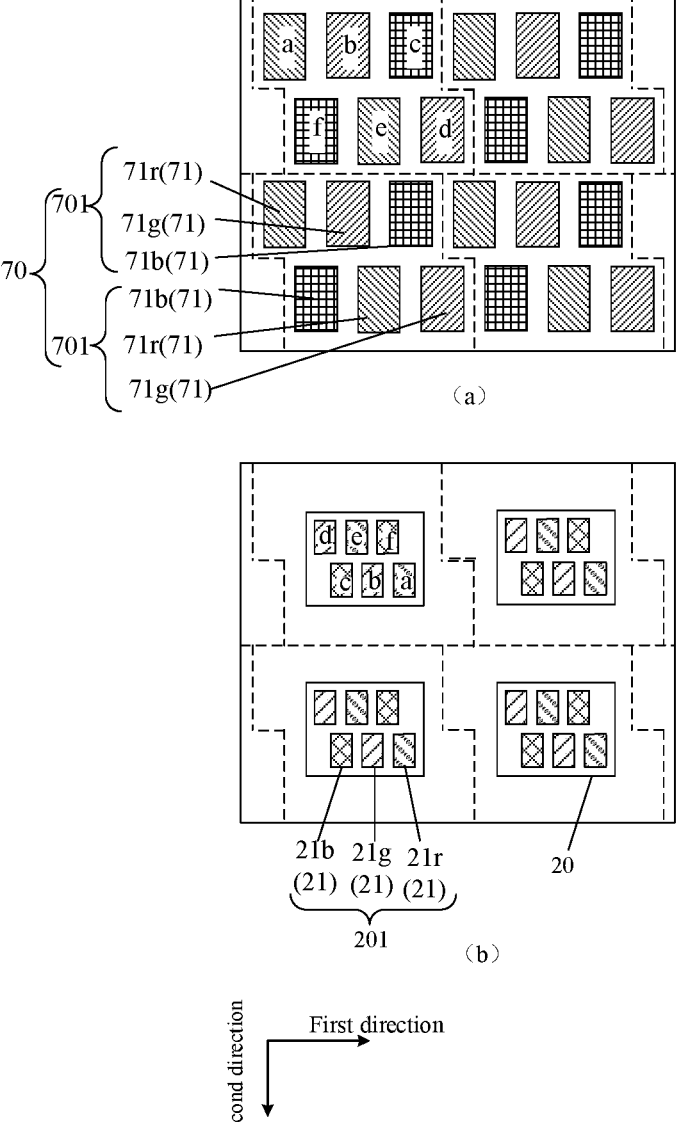
FIG. 11 is a second schematic diagram showing distribution of light-emitting device groups and light-transmitting part groups according to some other embodiments of the present disclosure.
Figure 12:
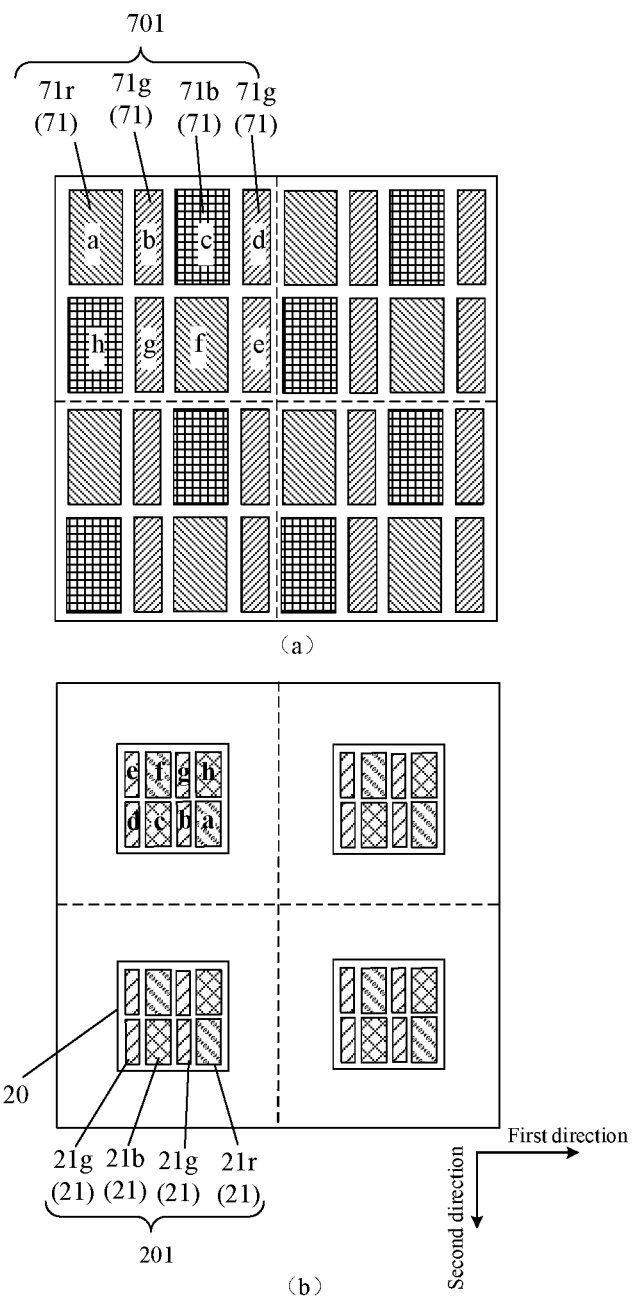
FIG. 12 is a third schematic diagram showing distribution of light-emitting device groups and light-transmitting part groups according to some other embodiments of the present disclosure.

FIG. 10 is a first schematic diagram showing distribution of light-emitting device groups and light-transmitting part groups according to some other embodiments of the present disclosure, FIG. 11 is a second schematic diagram showing distribution of light-emitting device groups and light-transmitting part groups according to some other embodiments of the present disclosure, and FIG. 12 is a third schematic diagram showing distribution of light-emitting device groups and light-transmitting part groups according to some other embodiments of the present disclosure. As shown in FIGS. 10 to 12, the plurality of optical device groups 20 are arranged in a plurality of rows and columns, and accordingly, the plurality of light-transmitting part groups 70 are arranged in a plurality of rows and columns. The light-transmitting part groups 70 are in one-to-one correspondence with the optical device groups 20, and an orthographic projection of each optical structure element 60 on the base substrate 11 covers an orthographic projection of one of the optical device groups 20 on the base substrate 11. For example, when the arrangement of FIG. 10 is adopted, the orthographic projection of the optical structure element 60 on the base substrate 11 may coincide with, or be tangent to, the dashed box in FIG. 10(b). When the arrangement of FIG. 11 is adopted, the orthographic projection of the optical structure element 60 on the base substrate 11 may coincide with, or be tangent to, the dashed box in FIG. 11(b). When the arrangement of FIG. 12 is adopted, the orthographic projection of the optical structure element 60 on the base substrate 11 may coincide with, or be tangent to, the dashed box in FIG. 12(b).

The plurality of light-transmitting parts 71 of each light-transmitting part group 70 are divided into n first repetitive units 701 arranged in a second direction, each repetitive unit 701 including c light-transmitting parts arranged in the first direction; and the plurality of micro light-emitting diodes 21 of each light-emitting device group 20 are divided into n second repetitive units 201 arranged in the second direction, each repetitive unit 201 including c micro light-emitting diodes 21 arranged in the first direction. The first direction intersects the second direction, and n and c are both integers greater than 1. In each of FIGS. 10 to 12, n=2 is taken as an example for explanation.

In the example shown in FIG. 10, in each light-emitting device group 20, the second repetitive unit 201 includes: a third micro light-emitting diode 21b, a second micro light-emitting diode 21g, a first micro light-emitting diode 21r, a third micro light-emitting diode 21b, a second micro light-emitting diode 21g, and a first micro light-emitting diode 21r sequentially arranged in the first direction. Taking the case where each light-emitting device group 20 includes two second repetitive units 201 as an example, 12 micro light-emitting diodes 21 of the two second repetitive units 201 may be arranged in two rows and six columns.

In the example shown in FIG. 11, some of the second repetitive units 201 each include: a second micro light-emitting diode 21g, a first micro light-emitting diode 21r, and a third micro light-emitting diode 21b sequentially arranged in the first direction, while the rest second repetitive units each include: a third micro light-emitting diode 21b, a second micro light-emitting diode 21g, and a first micro light-emitting diode 21r sequentially arranged in the first direction. Taking the case where each light-emitting device group 20 includes two second repetitive units 201 as an example, the micro light-emitting diodes 21 of the two second repetitive units 201 may be arranged in a staggered manner.

In the example shown in FIG. 12, in each light-emitting device group 20, some of the second repetitive units 201 each include: a second micro light-emitting diode 21g, a first micro light-emitting diode 21r, a second micro light-emitting diode 21g, and a third micro light-emitting diode 21b sequentially arranged in the first direction; while the rest second repetitive units 201 each include: a second micro light-emitting diode 21g, a third micro light-emitting diode 21b, a second micro light-emitting diode 21g, and a first micro light-emitting diode 21r sequentially arranged in the first direction. Taking the case where each light-emitting device group 20 includes two second repetitive units 201 as an example, 8 micro light-emitting diodes 21 of the two repetitive units may be arranged in two rows and four columns.

In FIGS. 10 to 11, the orthographic projections of different micro light-emitting diodes 21 on the base substrate 11 may have the same area. In FIG. 12, the orthographic projections of different micro light-emitting diodes 21 on the base substrate 11 may have different areas or the same area. For example, the orthographic projection of the first micro light-emitting diode 21r on the base substrate 11 and the orthographic projection of the third micro light-emitting diode 21b on the base substrate 11 each have an area larger than the orthographic projection of the second micro light-emitting diode 21g on the base substrate 11.

In FIGS. 10 to 12, for any light-emitting device group 20, after passing through the optical structure elements 60, light emitted from a $q^{th}$ micro light-emitting diode 21 in a $j^{th}$ second repetitive unit 201 is radiated to a $(c−q+1)^{th}$ light-transmitting part in a $(n−j+1)^{th}$ first repetitive unit in the corresponding light-transmitting part group 70, where n and c are both integers greater than 1, q and j are both integers, and $1{\le}q{\le}c$ and $1{\le}j{\le}n$.

It should be noted that the $j^{th}$ second repetitive unit 201 refers to the $j^{th}$ second repetitive unit 201 arranged in the second direction; and the $(n−j+1)^{th}$ first repetitive unit refers to the $(n−j+1)^{th}$ first repetitive unit 701 arranged in the second direction. The $q^{th}$ micro light-emitting diode 21 refers to the $q^{th}$ micro light-emitting diode 21 arranged in the first direction; and the $(c−q+1)^{th}$ light-transmitting part refers to the $(c−q+1)^{th}$ light-transmitting part 71 arranged in the first direction.

For example, as shown in FIGS. 10 to 12, after passing through the condenser lens, light emitted from any micro light-emitting diode 21, denoted with a letter, is emitted toward the light-transmitting part 71 denoted with the same letter.

An embodiment of the present disclosure further provides a display apparatus, including the display panel in any of the above embodiments. The display apparatus may be: electronic paper, a mobile phone, a tablet PC, a television, a monitor, a notebook computer, a digital album, a GPS or any other product or component having a display function.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A display panel, comprising: a plurality of light-emitting device groups, a plurality of light-transmitting part groups and a plurality of optical structure elements, wherein the plurality of light-emitting device groups are disposed on a base substrate, each of the plurality of light-emitting device groups comprises a plurality of light-emitting diodes, the plurality of light-emitting diodes comprise a first light-emitting diodes and a second light-emitting diodes, and the first light-emitting diode and the second light-emitting diode are each configured to emit light of a preset color;

the plurality of light-transmitting part groups are disposed on a light-emitting side of the plurality of light-emitting device groups, each of the plurality of light-transmitting part groups comprises a plurality of light-transmitting parts, and the plurality of light-transmitting parts comprise a first color conversion part and a second color conversion part; and the plurality of optical structure elements are disposed between the plurality of light-emitting device groups and the plurality of light-transmitting part groups, an orthographic projection of each of the plurality of optical structure elements on the base substrate entirely covers an orthographic projection of the plurality of light-emitting diodes of at least one of the plurality of light-emitting device groups on the base substrate, each of the plurality of optical structure elements is configured to direct light emitted from the first light-emitting diode to the first color conversion part, and direct light emitted from the second light-emitting diode to the second color conversion part, wherein the first color conversion part is configured to convert light of the preset color into light of a first color, and the second color conversion part is configured to convert light of the preset color into light of a second color, wherein each of the plurality of optical structure elements is a condenser lens, wherein the plurality of light-transmitting parts of each light-transmitting part group are arranged and sequentially numbered in a first direction, and the plurality of light-emitting diodes of each light-emitting device groups are arranged and sequentially numbered in a same order as the plurality of light-transmitting parts in the first direction, and wherein for any light-emitting device group, after passing through the optical structure element, light emitted from a $i^{th}$ light-emitting diode is radiated to a $(m-i+1)^{th}$ light-transmitting part of a corresponding light-transmitting part group, where m is a number of the plurality of light-transmitting parts of the light-transmitting part group, i is an integer, $1 \leq i \leq m$ and $m > 1$.

2. The display panel according to claim 1, wherein the light of the first color is different from the light of the second color in wavelength range.

3. The display panel according to claim 1, wherein the plurality of light-emitting diodes of the light-emitting device group further comprise: a third light-emitting diode configured to emit light of the preset color, the plurality of light-transmitting parts in the light-transmitting part group further comprise a light-passing part, the orthographic projection of each of the plurality of optical structure elements on the base substrate further covers an orthographic projection of the third light-emitting diode on the base substrate, and each of the plurality of optical structure elements is further configured to direct light emitted from the third light-emitting diode to the light-passing part.

4. The display panel according to claim 3, wherein the light of the preset color is blue light, the light of the first color is red light, and the light of the second color is green light.

5. The display panel according to claim 1, wherein the plurality of light-emitting diodes of each light-emitting device group further comprise: a third light-emitting diode configured to emit light of the preset color, the plurality of light-transmitting parts of the light-transmitting groups further comprise a third color conversion part, the orthographic projection of each of the plurality of optical structure elements on the base substrate further covers an orthographic projection of the third light-emitting diode on the base substrate, and each of the plurality of optical structure elements is further configured to direct light emitted from the third light-emitting diode to the third color conversion part, and the third color conversion part is configured to convert light of the preset color into light of a third color.

6. The display panel according to claim 5, wherein the light of the preset color is ultraviolet light, the light of the first color is red light, the light of the second color is green light, and the light of the third color is blue light; or the light of the preset color is blue light having a first wavelength, the light of the first color is red light, the light of the second color is green light, the light of the third color is blue light having a second wavelength, and the first wavelength is less than the second wavelength.

7. The display panel according to claim 1, wherein the display panel further comprises;

light-transmitting carriers in one-to-one correspondence with the plurality of light-emitting device groups, and the light-transmitting carriers corresponding to different light-emitting device groups are arranged at intervals; and a barrier layer on a side of the light-transmitting carriers facing the base substrate, wherein a plurality of accommodation openings are provided in the barrier layer, and the plurality of light-emitting diodes of the light-emitting device group are in the plurality of accommodation openings in one-to-one correspondence.

8. The display panel according to claim 7, wherein a light-shielding layer is provided between any adjacent two of the light-transmitting carriers.

9. The display panel according to claim 7, wherein the light-emitting diode comprises:

a first electrode on a side of the light-transmitting carriers facing the base substrate;

a light-emitting stack on a side of the first electrode away from the light-transmitting carriers and comprising: a first-type doped semiconductor layer, a quantum well layer and a second-type doped semiconductor layer sequentially arranged in a direction away from the light-transmitting carriers; and a second electrode on a side of the light-emitting stack away from the light-transmitting carriers.

10. The display panel according to claim 1, wherein the display panel further comprises:

a packaging layer on a side of the plurality of light-emitting device groups away from the base substrate; and a filling layer between the packaging layer and the plurality of optical structure elements;

a spacer substrate between the plurality of optical structure elements and the plurality of light-transmitting part groups;

wherein the optical structure element has a refractive index greater than the filling layer, a surface of the optical structure element facing the filling layer is a convex curved surface that is attached to the filling layer.

11. The display panel according to claim 1, wherein the display panel further comprises:

a packaging layer on a side of the plurality of light-emitting device groups away from the base substrate, wherein the plurality of optical structure elements are disposed on a surface of the packaging layer away from the base substrate; and

17

18 a spacer substrate between the plurality of optical structure elements and the plurality of light-transmitting part groups and provided with recesses in one-to-one correspondence with the optical structure elements, wherein a surface of the optical structure element facing the spacer substrate is a convex curved surface that is attached to a corresponding recess, and the optical structure element has a refractive index greater than the spacer substrate.

12. The display panel according to claim 1, wherein a distance between the plurality of light-emitting diodes and the plurality of optical structure elements is 1 or 2 times a focal length of the condenser lenses, and the condenser lens has a first surface and a second surface, and the second surface is a convex surface that is convex toward a respective one of the plurality of light-emitting device groups.

13. The display panel according to claim 1, wherein an orthographic projection of the first color conversion part on the base substrate has an area larger than an orthographic projection of the first light-emitting diode on the base substrate; and an orthographic projection of the second color conversion part on the base substrate has an area larger than an orthographic projection of the second light-emitting diode on the base substrate.

14. The display panel according to claim 1, wherein the first color conversion part and the second color conversion part are each made of a material comprising a quantum dot material or a phosphor material.

15. The display panel according to claim 1, wherein the display panel further comprises: an accommodation structure layer having a plurality of accommodation grooves in which the plurality of light-transmitting parts are provided in one-to-one correspondence with the plurality of accommodation grooves.

16. The display panel according to claim 1, wherein the plurality of light-emitting diodes of each light-emitting device group are divided into at least one repetitive unit, each repetitive unit comprising: the third light-emitting diode, the second light-emitting diode and the first light-emitting diode sequentially arranged in the first direction.

17. The display panel according to claim 1, wherein the plurality of light-transmitting parts of each light-transmitting part group are divided into n first repetitive units arranged in a second direction, each repetitive unit comprising c light-transmitting parts arranged in a first direction; the plurality of light-emitting diodes of each light-emitting device group are divided into n second repetitive units arranged in the second direction, each repetitive unit comprising c light-emitting diodes arranged in the first direction; wherein the first direction intersects the second direction; and for any light-emitting device group, after passing through the optical structure element, light emitted from a $q^{th}$ light-emitting diode of a $j^{th}$ second repetitive unit is radiated to a $(c-q+1)^{th}$ light-transmitting part of a $(n-j+1)^{th}$ first repetitive unit of a corresponding light-transmitting part group, where n and c are both integers greater than 1, q and j are both integers, $1 \leq q \leq c$ and $1 \leq j \leq n$.

18. The display panel according to claim 17, wherein in each light-emitting device group, each second repetitive unit comprises: the third light-emitting diode, the second light-emitting diode, and the first light-emitting diode, the third light-emitting diode, the second light-emitting diode, and the first light-emitting diode sequentially arranged in the first direction; or, in each light-emitting device group, some of the second repetitive units each comprise: the second light-emitting diode, the first light-emitting diode, and the third light-emitting diode sequentially arranged in the first direction, while remaining second repetitive units each comprise: the third light-emitting diode, the second light-emitting diode, and the first light-emitting diode sequentially arranged in the first direction; or, in each light-emitting device group, some of the second repetitive units each comprise: the second light-emitting diode, the first light-emitting diode, the second light-emitting diode, and the third light-emitting diode sequentially arranged in the first direction; while remaining second repetitive units each comprise: the second light-emitting diode, the third light-emitting diode, the second light-emitting diode, and the first light-emitting diode sequentially arranged in the first direction.

19. A display apparatus, comprising the display panel according to claim 1, and each of the plurality of light-emitting diodes is a micro light-emitting diode.

20. The display panel according to claim 1, wherein the condenser lens has a first surface and a second surface, and the second surface is a convex surface that is convex toward a respective one of the plurality of light-transmitting part groups.

* * * * *